(12) United States Patent
Kim et al.

(10) Patent No.: US 8,823,183 B2
(45) Date of Patent: Sep. 2, 2014

(54) BUMP FOR SEMICONDUCTOR PACKAGE, SEMICONDUCTOR PACKAGE HAVING BUMP, AND STACKED SEMICONDUCTOR PACKAGE

(75) Inventors: Ki Young Kim, Seongnam-si (KR); Qwan Ho Chung, Seoul (KR); Sung Ho Hyun, Seoul (KR); Myung Gun Park, Seoul (KR); Jin Ho Bae, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 702 days.

(21) Appl. No.: 12/981,329

(22) Filed: Dec. 29, 2010

(65) Prior Publication Data

US 2012/0091584 A1   Apr. 19, 2012

(30) Foreign Application Priority Data

Oct. 19, 2010   (KR) .......................... 10-2010-0101734

(51) Int. Cl.
　　*H01L 23/48*　　(2006.01)
　　*H01L 23/00*　　(2006.01)
　　*H01L 25/065*　　(2006.01)
　　*H01L 23/31*　　(2006.01)

(52) U.S. Cl.
CPC ............... *H01L 24/13* (2013.01); *H01L 24/05* (2013.01); *H01L 2224/02377* (2013.01); *H01L 25/0657* (2013.01); *H01L 2224/73204* (2013.01); *H01L 2224/14156* (2013.01); *H01L 2224/73207* (2013.01); *H01L 2224/48227* (2013.01); *H01L 2224/73265* (2013.01); *H01L 2224/13016* (2013.01); *H01L 2224/13139* (2013.01); *H01L 2224/05554* (2013.01); *H01L 2224/13015* (2013.01); *H01L 2224/32225* (2013.01); *H01L 2224/13193* (2013.01); *H01L 2924/01013* (2013.01); *H01L 2224/13155* (2013.01); *H01L 24/16* (2013.01); *H01L 2224/02379* (2013.01); *H01L 2924/01029* (2013.01); *H01L 2224/05552* (2013.01); *H01L 2924/01049* (2013.01); *H01L 2224/16145* (2013.01); *H01L 2224/13006* (2013.01); *H01L 2924/01079* (2013.01); *H01L 2224/13109* (2013.01); *H01L 2224/14155* (2013.01); *H01L 2224/16106* (2013.01); *H01L 2224/13144* (2013.01); *H01L 2225/0651* (2013.01); *H01L 2224/16227* (2013.01); *H01L 2224/14051* (2013.01); *H01L 2224/16105* (2013.01); *H01L 2924/01006* (2013.01); *H01L 2924/01033* (2013.01); *H01L 2224/13116* (2013.01); *H01L 2224/13019* (2013.01); *H01L 2924/0105* (2013.01); *H01L 2225/06513* (2013.01); *H01L 2224/13012* (2013.01); *H01L 2224/13082* (2013.01); *H01L 2924/01047* (2013.01); *H01L 2224/05548* (2013.01); *H01L 2224/13147* (2013.01); *H01L 2224/05567* (2013.01); *H01L 2224/13008* (2013.01); *H01L 2224/13024* (2013.01); *H01L 2224/13111* (2013.01); *H01L 2224/1403* (2013.01); *H01L 23/3128* (2013.01); *H01L 2224/13022* (2013.01); *H01L 2924/014* (2013.01); *H01L 24/14* (2013.01); *H01L 2924/01082* (2013.01); *H01L 2224/13124* (2013.01); *H01L 2924/15311* (2013.01)
USPC ...... 257/781; 257/738; 257/734; 257/E23.01; 257/686; 257/777; 257/780

(58) Field of Classification Search
USPC ............ 257/686, 734, 738, E23.01, 780, 781, 257/777
See application file for complete search history.

(56) References Cited

U.S. PATENT DOCUMENTS

| | | | |
|---|---|---|---|
| 3,770,874 A * | 11/1973 | Krieger et al. | 174/257 |
| 6,740,822 B2 * | 5/2004 | Watanabe | 174/260 |
| 7,531,898 B2 | 5/2009 | Batchelor | |
| 8,227,332 B2 * | 7/2012 | Coffy et al. | 438/613 |
| 2003/0218246 A1 * | 11/2003 | Abe et al. | 257/734 |
| 2011/0204505 A1 * | 8/2011 | Pagaila et al. | 257/686 |

FOREIGN PATENT DOCUMENTS

| | | | |
|---|---|---|---|
| JP | 2009212114 A | | 9/2009 |
| KR | 100377471 B1 | | 3/2003 |
| KR | 1020060045689 A | | 5/2006 |
| KR | 1020060074143 A | | 7/2006 |
| KR | 1020070007636 A | | 1/2007 |

* cited by examiner

*Primary Examiner* — S. V. Clark
*Assistant Examiner* — Krista Soderholm

(74) *Attorney, Agent, or Firm* — William Park & Associates Ltd.

(57) ABSTRACT

A bump for a semiconductor package includes: a first bump formed on a semiconductor chip and having at least two land parts and a connection part which connects the land parts and has a line width smaller than the land parts; and a second bump formed on the first bump and projecting on the land parts of the first bump in shapes of a hemisphere.

17 Claims, 13 Drawing Sheets

US 8,823,183 B2

BUMP FOR SEMICONDUCTOR PACKAGE, SEMICONDUCTOR PACKAGE HAVING BUMP, AND STACKED SEMICONDUCTOR PACKAGE

CROSS-REFERENCE TO RELATED APPLICATIONS

The present application claims priority to Korean patent application number 10-2010-101734 filed on Oct. 19, 2010, which is incorporated herein by reference in its entirety.

TECHNICAL FIELD

The present invention generally relates to a bump for a semiconductor package, and more particularly a semiconductor package having the bump, and a stacked semiconductor package.

BACKGROUND OF THE INVENTION

As various electric/electronic products are scaled down, research has been actively conducted to mount an increased number of chips to a substrate within a limited size and thereby realize miniaturization and high capacity. Accordingly, the size and thickness of a semiconductor package gradually decrease. For example, a chip size package, in which a chip size is no less than 80% of the total size of a semiconductor package, has been suggested. The chip size package has been developed into various types due to advantages resulting from a light, slim, compact and miniature structure thereof.

As a method of mounting typical semiconductor chips and some chip size packages to printed circuit boards, soldering using a lead frame is employed. While soldering using a lead frame may enhance performance in terms of a process and reliability, issues may be caused in terms of electrical characteristics due to the fact that a transfer length of an electrical signal is long. Under these situations, a flip chip package structure using bumps may minimize the electrical signal transfer length.

A flip chip package has a structure in which a semiconductor chip is bonded to a printed circuit board by bumps formed on bonding pads of the semiconductor chip and at the same time, the semiconductor chip and the printed circuit board are electrically connected with each other. In the flip chip package, since transfer of an electrical signal between the semiconductor chip and the printed circuit board is implemented only by the bumps, a signal transfer length becomes very short. However, if even one of the bumps connecting the semiconductor chip and the printed circuit board is poorly connected, a corresponding product cannot be used, which causes a decrease in manufacturing yield.

A method has been proposed, in which redistribution lines connected with bonding pads are formed on a semiconductor chip and at least two separate bumps are formed on the redistribution lines. While this method may lead to better manufacturing yield, since the redistribution lines and the bumps should be individually formed using separate masks, the manufacturing costs and the number of processes increase due to separate formation of the masks.

BRIEF SUMMARY OF THE INVENTION

Embodiments of the present invention are directed to a bump for a semiconductor package, which can improve the manufacturing yield, reduce the manufacturing cost and decrease the number of processes, a semiconductor package having the bump, and a stacked semiconductor package.

In one embodiment of the present invention, a bump for a semiconductor package includes: a first bump formed on a semiconductor chip and having at least two land parts and a connection part which connects the land parts and has a line width smaller than the land parts; and a second bump formed on the first bump and projecting on the land parts of the first bump in shapes of a hemisphere.

The second bump may have the same shape as the first bump when viewed from the top, and the land parts may circular or polygonal shapes when viewed from the top.

The line width of the connection part may correspond to $\frac{1}{10}$ to $\frac{1}{2}$ times a line width of the land part.

The second bump may have a melting point lower than that of the first bump. In detail, the first bump may include any one selected from the group consisting of copper (Cu), nickel (Ni), aluminum (Al), carbon nanotubes, gold (Au), silver (Ag) and lead (Pb). The second bump may include any one selected from the group consisting of an alloy of Sn, Ag and Cu, an alloy of Pb and Sn and an alloy of In and Bi.

In another embodiment of the present invention, a semiconductor package includes: a semiconductor chip having a first surface on which bonding pads are formed and a second surface which faces away from the first surface; and bumps formed on the first surface of the semiconductor chip and electrically connected with the bonding pads, wherein each bump includes a first bump formed on a semiconductor chip and having at least two land parts and a connection part which connects the land parts and has a line width smaller than the land parts, and a second bump formed on the first bump and projecting on the land parts of the first bump in shapes of a hemisphere.

The second bump may have the same shape as the first bump when viewed from the top, and the land parts may have circular or polygonal shapes when viewed from the top.

The line width of the connection part may correspond to $\frac{1}{10}$ to $\frac{1}{2}$ times a line width of the land part.

Any one of the land parts of the first bump may be connected to each bonding pad of the semiconductor chip, or the connection part of the first bump may be connected to each bonding pad of the semiconductor chip.

The semiconductor package may further include: redistribution lines formed on the first surface of the semiconductor chip and electrically connecting the bonding pads with the bumps.

The semiconductor package may further include: a substrate having bond fingers two of which are respectively connected to projecting portions of each second bump.

The semiconductor package may further include: a substrate having bond fingers each of which is simultaneously connected to projecting portions of each second bump.

In another embodiment of the present invention, a stacked semiconductor package includes: a stacked semiconductor chip module including a first semiconductor chip having a first surface on which first bonding pads and redistribution lines connected to the first bonding pads are formed and a second surface which faces away from the first surface, a second semiconductor chip stacked over the first semiconductor chip and having a third surface which faces the first semiconductor chip and on which second bonding pads are formed, and bumps formed on the third surface of the second semiconductor chip and electrically connecting the second bonding pads of the second semiconductor chip with the redistribution lines of the first semiconductor chip; a substrate supporting the stacked semiconductor chip module; and connection members electrically connecting the redistribution lines of the first semiconductor chip with the substrate, wherein each bump includes: a first bump formed on the third; and a second bump formed on the first bump, and connected to the redistribution lines of the first semiconductor chip.

The first bump and the second bump may have the same shape when viewed from the top, and the first land part and the second land part may have circular or polygonal shapes when viewed from the top.

The connection part may have a line width corresponding to 1/10 to 1/2 times a line width of the first land part and the second land part.

Any one of the land parts may be connected to each second bonding pad of the second semiconductor chip, or the connection part may be connected to each second bonding pad of the second semiconductor chip.

The stacked semiconductor package may further include: additional redistribution lines formed on the third surface of the second semiconductor chip and electrically connecting the second bonding pads of the second semiconductor chip with the bumps.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
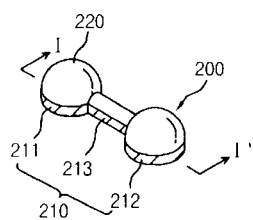
FIG. 1 is a perspective view illustrating a bump for a semiconductor package in accordance with an embodiment of the present invention.
Figure 2:
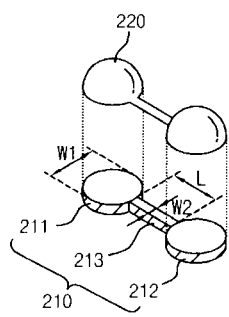
FIG. 2 is an exploded perspective view of the bump shown in FIG. 1.
Figure 3:
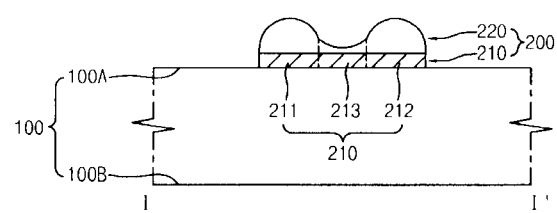
FIG. 3 is a cross-sectional view taken along the line I-I' of FIG. 1.

FIG. 1 is a perspective view illustrating a bump for a semiconductor package in accordance with an embodiment of the present invention, FIG. 2 is an exploded perspective view of the bump shown in FIG. 1, and FIG. 3 is a cross-sectional view taken along the line I-I' of FIG. 1.

The bump for a semiconductor package shown in FIGS. 1 and 2 is suitable for mounting a semiconductor chip to an electronic part such as a printed circuit board, a semiconductor chip, and the like.

Referring to FIG. 3, a semiconductor chip 100 has a first surface 100A and a second surface 100B which faces away from the first surface 100A.

Bumps 200 are formed on the first surface 100A of the semiconductor chip 100.

Referring to FIGS. 1 through 3, each bump 200 includes a first bump 210 and a second bump 220 which is formed on the first bump 210. That is to say, the bump 200 has a double structure. The first bump 210 includes first and second land parts 211 and 212 and a connection part 213. Each of the first and second land parts 211 and 212 has a circular shape when viewed from the top. Each of the first and second land parts 211 and 212, however, may have a polygonal shape when viewed from the top. Although it is illustrated and explained in the present embodiment that two land parts are formed, it is to be noted that at least three land parts may also be formed.

The connection part 213 connects the first land part 211 and the second land part 212. In the present embodiment, the connection part 213 has a linear shape when viewed from the top. The connection part 213 has a line width smaller than the first and second land parts 211 and 212. For example, when a line width of the first and second land parts 211 and 212 is W1, a line width W2 of the connection part 213 has a range of 1/10×W1 to 1/2×W1. Further, a length L of the connection part 213 has a range of 1/10×W1 to 5×W1.

The first bump 210 includes any one selected from the group comprising copper (Cu), nickel (Ni), aluminum (Al), carbon nanotubes, gold (Au), silver (Ag) and lead (Pb).

The second bump 220 is formed on the first bump 210. The second bump 220 has the same shape as the first bump 210 when viewed from the top. The second bump 220 projects in the shape of hemispheres on the first and second land parts 211 and 212, and is formed thin on the surface of the connection part 213.

The second bump 220 is formed of a material which has a melting point lower than that of the first bump 210. For example, the second bump 220 includes any one selected from the group comprising an alloy of tin (Sn), silver (Ag) and copper (Cu), an alloy of lead (Pb) and tin (Sn) and an alloy of indium (In) and bismuth (Bi).

Figure 4:
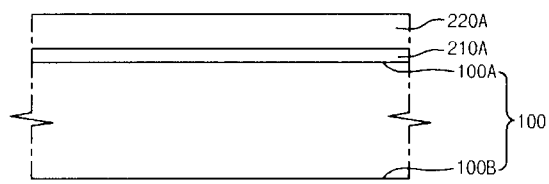
FIGS. 4 through 8 are views explaining a method for forming a bump in accordance with another embodiment of the present invention.
Figure 5:
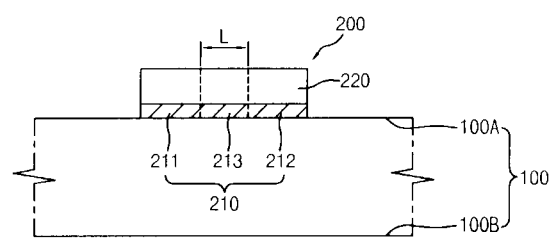
Figure 6:
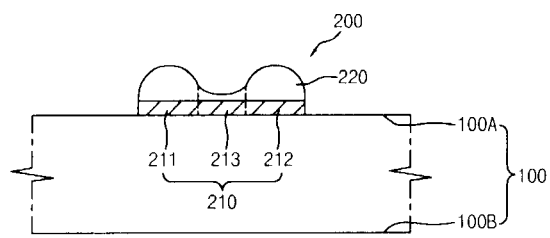
Figure 7:
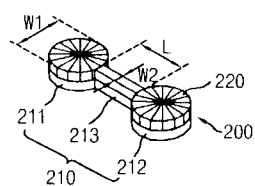
Figure 8:
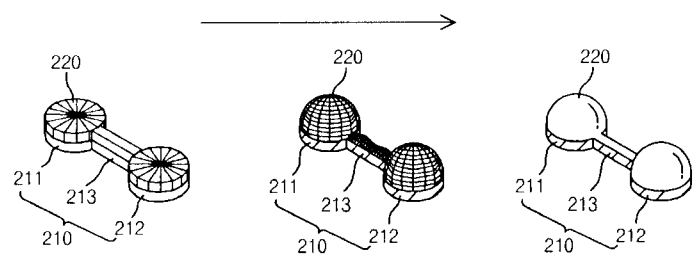

FIGS. 4 through 8 are views explaining a method for forming a bump in accordance with another embodiment of the present invention. FIGS. 4 through 6 are cross-sectional views according to a sequence of processes, FIG. 7 is a perspective view illustrating a first bump in the process shown in FIG. 5, and FIG. 8 is a perspective view illustrating a shape change of a second bump when performing a reflow process.

Referring to FIG. 4, in order to form a bump for a semiconductor package in accordance with another embodiment of the present invention, first, a first metal layer 210A for first bumps and a second metal layer 220A for second bumps are deposited on a first surface 100A of a semiconductor chip 100.

As a method for forming the first metal layer 210A for first bumps and the second metal layer 220A for second bumps, any one of an electroplating process, an electroless plating process and a sputtering process may be used.

As a material for the first metal layer 210A for first bumps, any one selected from the group comprising copper (Cu), nickel (Ni), aluminum (Al), carbon nanotubes, gold (Au), silver (Ag) and lead (Pb) may be used, and as a material for the second metal layer 210B for second bumps, a material which has a melting point lower than that of the first metal layer 210A for first bumps, for example, any one selected from the group comprising an alloy of Sn, Ag and Cu, an alloy of Pb and Sn and an alloy of In and Bi may be used.

Referring to FIGS. 5 and 7, by patterning the second metal layer 220A for second bumps and the first metal layer 210A for first bumps through a photolithographic process, second bumps 220 and first bumps 210 are formed.

Each of the first bumps 210 which are formed through the photolithographic process has first and second land parts 211 and 212 which have circular shapes, and a connection part 213 which connects the first land part 211 and the second land part 212 and has a line width smaller than the first and second land parts 211 and 212. When a line width of the first and second land parts 211 and 212 is W1, a line width W2 of the connection part 213 is determined in the range of $\frac{1}{10} \times W1$ to $\frac{1}{2} \times W1$, and a length L of the connection part 213 is determined in the range of $\frac{1}{10} \times W1$ to $5 \times W1$. Although it is illustrated and explained in the present embodiment that the first and second land parts 211 and 212 are formed into the circular shapes, it is to be noted that the first and second land parts 211 and 212 can also be formed into polygonal shapes. Further, although it is illustrated and explained in the present embodiment that two land parts are formed, it is to be noted that at least three land parts may also be formed.

Besides the above-described method, the first and second bumps 210 and 220 may be formed according to the following method.

A mask pattern is formed on the first surface 100A of the semiconductor chip 100 in such a way as to open regions where bumps are to be formed, and first bumps 210 are formed on the regions of the semiconductor chip 100 which are opened by the mask pattern, through performing any one of an electroplating process, an electroless plating process and a sputtering process. Next, second bumps 220 are formed on the first bumps 210 through performing an electroplating process or a stencil printing process, and then, the mask pattern is removed.

Referring to FIG. 6, after the first and second bumps 210 and 220 are formed, the second bumps 220 are reflowed such that the second bumps 220 project in the shape of hemispheres on the first and second land parts 211 and 212 of the first bumps 210. Such a reflow process is performed within a temperature range in which the first bumps 210 are not melted. In the reflow process, the second bumps 220 are melted into a liquid state, and portions of the second bumps 220 in the liquid state flow toward the first and second land parts 211 and 212 of the first bumps 210 by surface tension. As a consequence, as indicated by the arrow in FIG. 8, the second bumps 220 gradually project on the first and second land parts 211 and 212 in the shapes of a hemisphere, and as a thickness of the second bumps 220 gradually decreases on the connection parts 213 of the first bumps 210, the second bumps 220 finally formed thin on the surfaces of the connection parts 213 of the first bumps 210.

Figure 9:
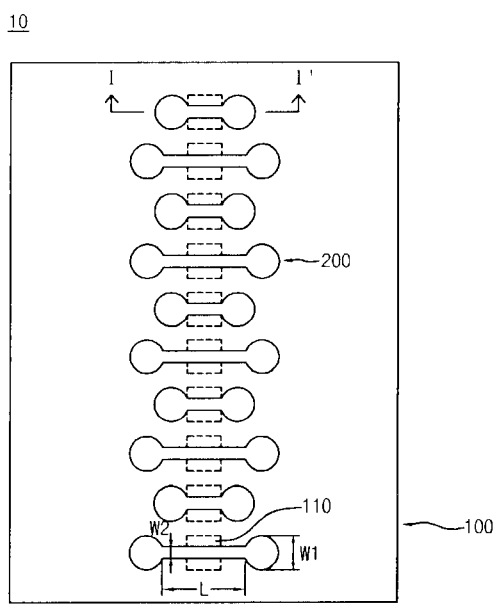
FIG. 9 is a plan view illustrating a semiconductor package in accordance with another embodiment of the present invention.
Figure 10:
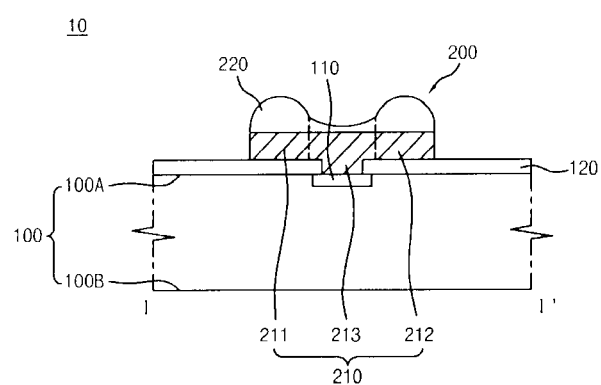
FIG. 10 is a cross-sectional view taken along the line I-I' of FIG. 9.

FIG. 9 is a plan view illustrating a semiconductor package in accordance with another embodiment of the present invention, and FIG. 10 is a cross-sectional view taken along the line I-I' of FIG. 9.

Referring to FIGS. 9 and 10, a semiconductor package 10 in accordance with an embodiment of the invention includes a semiconductor chip 100 and bumps 200.

The semiconductor chip 100 has a first surface 100A and a second surface 100B which faces away from the first surface 100A. Bonding pads 110 are formed on the first surface 100A of the semiconductor chip 100. In the present embodiment, a plurality of bonding pads 110 are formed along the center portion of the first surface 100A of the semiconductor chip 100. That is to say, the semiconductor chip 100 has a center pad type structure. The semiconductor chip 100 includes, for example, a circuit unit (not shown) which has a data storage section for storing data and a data processing section for processing data. The bonding pads 110 serve as electrical contacts of the circuit unit, for connection to an outside. An insulation layer pattern 120, which has openings for exposing the bonding pads 110, is formed on the first surface 100A of the semiconductor chip 100.

The bumps 200 are formed over the first surface 100A of the semiconductor chip 100 and are electrically connected with the bonding pads 110. Each bump 200 includes a first bump 210 and a second bump 220 which is formed on the first bump 210.

The first bump 210 includes first and second land parts 211 and 212 and a connection part 213. In the present embodiment, the first and second land parts 211 and 212 are disposed on the insulation layer pattern 120 of the semiconductor chip 100 and are respectively positioned on both sides of each bonding pad 110. The connection part 213 is connected to the bonding pad 110 and connects the first land part 211 and the second land part 212 with each other across the bonding pad 110.

Each of the first and second land parts 211 and 212 has a circular shape when viewed from the top. In another embodiment, however, each of the first and second land parts 211 and 212 may have a polygonal shape when viewed from the top. Although it is illustrated and explained in the present embodiment that two land parts are formed, it is to be noted that at least three land parts may also be formed.

In the present embodiment, the connection part 213 has a linear shape when viewed from the top. The connection part 213 has a line width smaller than the first and second land parts 211 and 212. For example, when a line width of the first and second land parts 211 and 212 is W1, a line width W2 of the connection part 213 has a range of $\frac{1}{10} \times W1$ to $\frac{1}{2} \times W1$. Further, a length L of the connection part 213 has a range of $\frac{1}{10} \times W1$ to $5 \times W1$.

The first bump 210 includes any one selected from the group comprising copper (Cu), nickel (Ni), aluminum (Al), carbon nanotubes, gold (Au), silver (Ag) and lead (Pb).

The second bump 220 is formed on the first bump 210. The second bump 220 has the same shape as the first bump 210 when viewed from the top. The second bump 220 projects in the shape of hemispheres on the first and second land parts 211 and 212, and is formed thin on the surface of the connection part 213. The second bump 220 is formed of a material which has a melting point lower than that of the first bump 210. For example, the second bump 220 includes any one selected from the group comprising an alloy of Sn, Ag and Cu, an alloy of Pb and Sn and an alloy of In and Bi.

Figure 11:
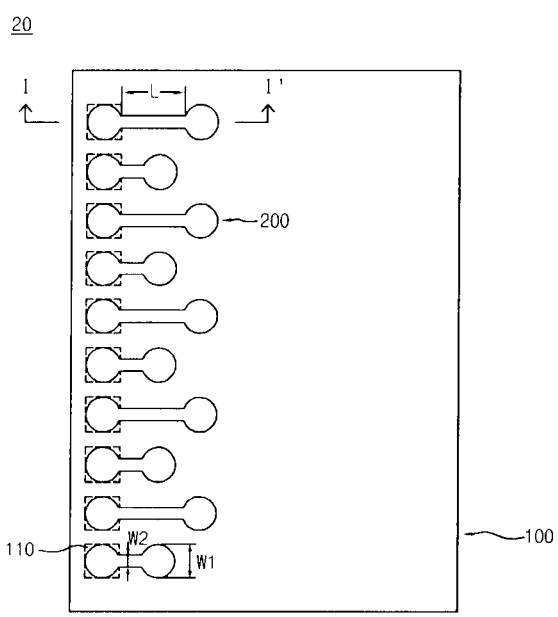
FIG. 11 is a plan view illustrating a semiconductor package in accordance with another embodiment of the present invention.
Figure 12:
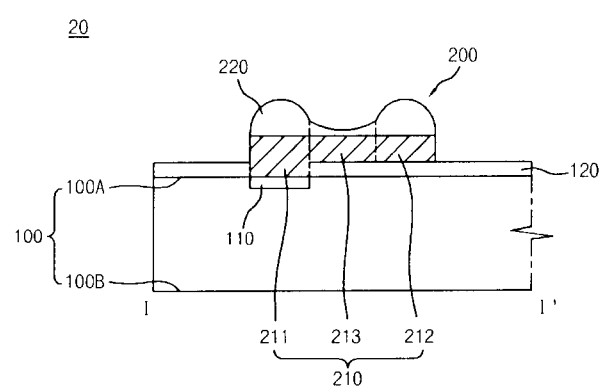
FIG. 12 is a cross-sectional view taken along the line I-I' of FIG. 11.

FIG. 11 is a plan view illustrating a semiconductor package in accordance with another embodiment of the present invention, and FIG. 12 is a cross-sectional view taken along the line I-I' of FIG. 11.

A semiconductor package 20 in accordance with the present embodiment of the invention has a substantially similar construction as the semiconductor package 10 according to the embodiment described above with reference to FIGS. 9 and 10, except that bonding pads 110 and bumps 200 may comprise a different construction from the semiconductor package 10. Accordingly, the same technical terms and the same reference symbols will be used for the same component parts.

Referring to FIGS. 11 and 12, the semiconductor package 20 in accordance with the present embodiment of the invention includes a semiconductor chip 100 and bumps 200.

The semiconductor chip 100 has a first surface 100A and a second surface 100B which faces away from the first surface 100A.

Bonding pads 110 are formed on the first surface 100A of the semiconductor chip 100. In the present embodiment, a plurality of bonding pads 110 are formed along an edge portion of the first surface 100A of the semiconductor chip 100. That is to say, the semiconductor chip 100 has an edge pad type structure. The semiconductor chip 100 includes, for example, a circuit unit (not shown) which has a data storage section for storing data and a data processing section for processing data. The bonding pads 110 serve as electrical contacts of the circuit unit, for connection to an outside. An insulation layer pattern 120, which has openings for exposing the bonding pads 110, is formed on the first surface 100A of the semiconductor chip 100.

The bumps 200 are formed over the first surface 100A of the semiconductor chip 100 and are electrically connected with the bonding pads 110. Each bump 200 includes a first bump 210 and a second bump 220 which is formed on the first bump 210. That is to say, the bump 200 has a double structure.

The first bump 210 comprises first and second land parts 211 and 212 and a connection part 213. In the present embodiment, the first land part 211 is disposed on each bonding pad 110 and is connected to the bonding pad 110. The second land part 212 is disposed on the insulation layer pattern 120, and the connection part 213 connects the first land part 211 and the second land part 212 with each other. Each of the first and second land parts 211 and 212 has a circular shape when viewed from the top. In another embodiment, however, each of the first and second land parts 211 and 212 may have a polygonal shape when viewed from the top. Although it is illustrated and explained in the present embodiment that two land parts are formed, it is to be noted that at least three land parts may also be formed.

In the present embodiment, the connection part 213 has a linear shape when viewed from the top. The connection part 213 has a line width smaller than the first and second land parts 211 and 212. For example, when a line width of the first and second land parts 211 and 212 is W1, a line width W2 of the connection part 213 has a range of ⅒×W1 to ½×W1. Further, a length L of the connection part 213 has a range of ⅒×W1 to 5×W1.

The first bump 210 includes any one selected from the group comprising copper (Cu), nickel (Ni), aluminum (Al), carbon nanotubes, gold (Au), silver (Ag) and lead (Pb).

The second bump 220 is formed on the first bump 210. The second bump 220 has the same shape as the first bump 210 when viewed from the top. The second bump 220 projects in the shape a hemispheres on the first and second land parts 211 and 212, and is formed thin on the surface of the connection part 213. The second bump 220 is formed of a material which has a melting point lower than that of the first bump 210. For example, the second bump 220 includes any one selected from the group comprising an alloy of Sn, Ag and Cu, an alloy of Pb and Sn and an alloy of In and Bi.

Figure 13:
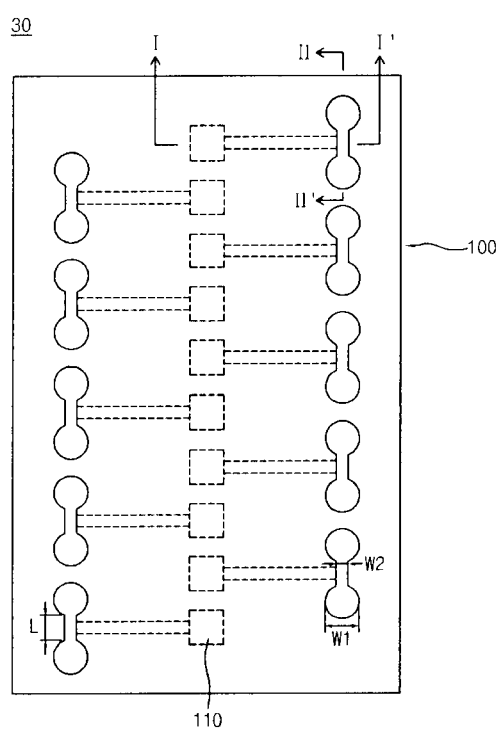
FIG. 13 is a plan view illustrating a semiconductor package in accordance with another embodiment of the present invention.
Figure 14:
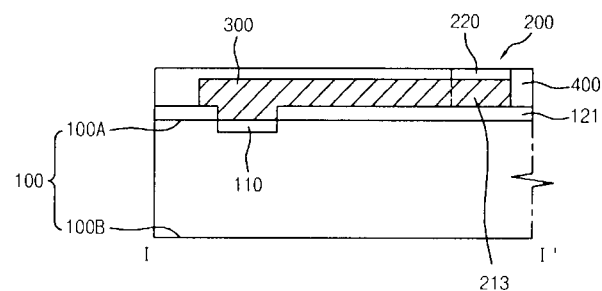
FIG. 14 is a cross-sectional view taken along the line I-I' of FIG. 13.
Figure 15:
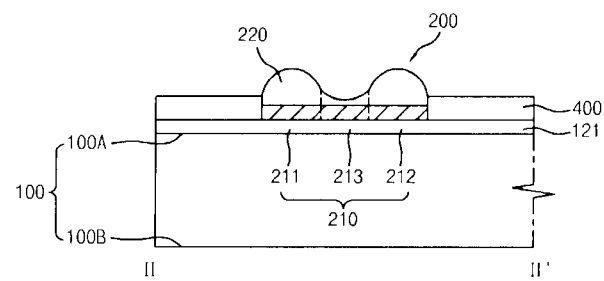
FIG. 15 is a cross-sectional view taken along the line II-II' of FIG. 13.

FIG. 13 is a plan view illustrating a semiconductor package in accordance with another embodiment of the present invention, FIG. 14 is a cross-sectional view taken along the line I-I' of FIG. 13, and FIG. 15 is a cross-sectional view taken along the line II-IF of FIG. 13.

Referring to FIGS. 13 through 15, a semiconductor package 30 in accordance with an embodiment of the invention includes a semiconductor chip 100, bumps 200 and redistribution lines 300. Furthermore, the semiconductor package 30 can further comprise a second insulation layer pattern 400.

The semiconductor chip 100 has a first surface 100A and a second surface 100B which faces away from the first surface 100A. Bonding pads 110 are formed on the first surface 100A of the semiconductor chip 100. In the present embodiment, a plurality of bonding pads 110 are formed along a center portion of the first surface 100A of the semiconductor chip 100. That is to say, the semiconductor chip 100 has a center pad type structure. The semiconductor chip 100 includes, for example, a circuit unit (not shown) which has a data storage section (not shown) for storing data and a data processing section (not shown) for processing data. The bonding pads 110 serve as electrical contacts of the circuit unit, for connection to an outside. A first insulation layer pattern 121, which has openings for exposing the bonding pads 110, is formed on the first surface 100A of the semiconductor chip 100.

The bumps 200 are formed over the first insulation layer pattern 121. Each bump 200 includes a first bump 210 and a second bump 220 which is formed on the first bump 210. That is to say, the bump 200 has a double structure.

The first bump 210 includes first and second land parts 211 and 212 and a connection part 213. In the present embodiment, the first and second land parts 211 and 212 are disposed on one side of each bonding pad 110, and the connection part 213 connects the first land part 211 and the second land part 212 with each other. Each of the first and second land parts 211 and 212 has a circular shape when viewed from the top. In another embodiment, however, each of the first and second land parts 211 and 212 may have a polygonal shape when viewed from the top. Although it is illustrated and explained in the present embodiment that two land parts are formed, it is to be noted that at least three land parts may also be formed.

In the present embodiment, the connection part 213 has a linear shape when viewed from the top. The connection part 213 has a line width smaller than the first and second land parts 211 and 212. For example, when a line width of the first and second land parts 211 and 212 is W1, a line width W2 of the connection part 213 has a range of ⅒×W1 to ½×W1. Further, a length L of the connection part 213 has a range of ⅒×W1 to 5×W1.

The first bump 210 includes any one selected from the group comprising copper (Cu), nickel (Ni), aluminum (Al), carbon nanotubes, gold (Au), silver (Ag) and lead (Pb).

The second bump 220 is formed on the first bump 210. The second bump 220 has the same shape as the first bump 210 when viewed from the top. The second bump 220 projects in the shape of hemispheres on the first and second land parts 211 and 212, and is formed thin on the surface of the connection part 213. The second bump 220 is formed of a material which has a melting point lower than that of the first bump 210. For example, the second bump 220 includes any one selected from the group comprising an alloy of Sn, Ag and Cu, an alloy of Pb and Sn and an alloy of In and Bi.

The redistribution lines 300 are formed on the bonding pads 110 and the first insulation layer pattern 121, and connect the bonding pads 110 of the semiconductor chip 100 with the first bumps 210. In the present embodiment, one end of the redistribution lines 300 are connected to the bonding pads 110 of the semiconductor chip 100, and an other end of the redistribution lines 300, which face away from the one ends, are connected to the connection parts 213 of the first bumps 210. In the present embodiment, the redistribution lines 300 are formed integrally with the first bumps 210.

The second insulation layer pattern 400 is formed on the first insulation layer pattern 121 in such a way as to cover the redistribution lines 300 and expose the bumps 200.

Figure 16:
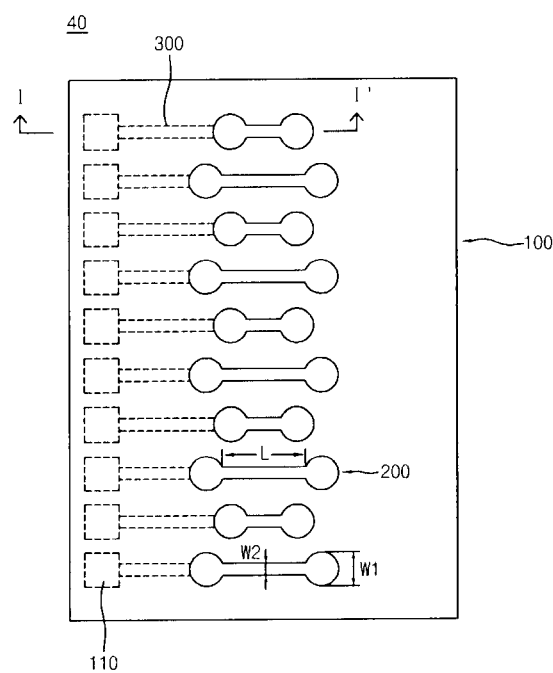
FIG. 16 is a plan view illustrating a semiconductor package in accordance with another embodiment of the present invention.
Figure 17:
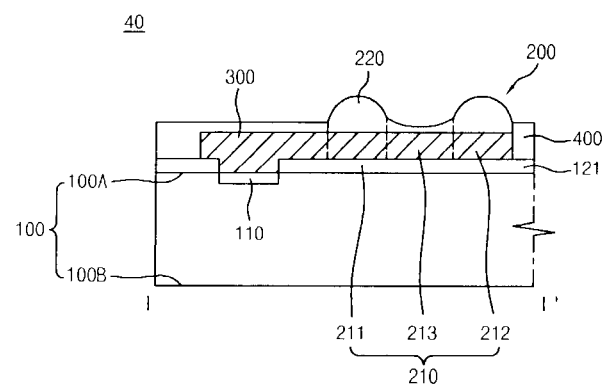
FIG. 17 is a cross-sectional view taken along the line I-I' of FIG. 16.

FIG. 16 is a plan view illustrating a semiconductor package in accordance with another embodiment of the present invention, and FIG. 17 is a cross-sectional view taken along the line I-I' of FIG. 16.

A semiconductor package 40 in accordance with an embodiment of the invention has a substantially similar construction as the semiconductor package 30 according to the embodiment described above with reference to FIGS. 13 through 15, except that bonding pads 110, bumps 200 and redistribution lines 300 may comprise a different construction from the semiconductor package 30. Accordingly, the same technical terms and the same reference symbols will be used for the same component parts.

Referring to FIGS. 16 and 17, the semiconductor package 40 in accordance with the present embodiment of the invention includes a semiconductor chip 100, bumps 200 and redistribution lines 300. Furthermore, the semiconductor package 40 can further comprise a second insulation layer pattern 400.

The semiconductor chip 100 has a first surface 100A and a second surface 100B which faces away from the first surface 100A. Bonding pads 110 are formed on the first surface 100A of the semiconductor chip 100. In the present embodiment, a plurality of bonding pads 110 are formed along an edge portion of the first surface 100A of the semiconductor chip 100. That is to say, the semiconductor chip 100 has an edge pad type structure. The semiconductor chip 100 includes, for example, a circuit unit (not shown) which has a data storage section (not shown) for storing data and a data processing section (not shown) for processing data. The bonding pads 110 serve as electrical contacts of the circuit unit, for connection to an outside. A first insulation layer pattern 121, which has openings for exposing the bonding pads 110, is formed on the first surface 100A of the semiconductor chip 100.

The bumps 200 are formed over the first insulation layer pattern 121. Each bump 200 includes a first bump 210 and a second bump 220 which is formed on the first bump 210. That is to say, the bump 200 has a double structure.

The first bump 210 includes first and second land parts 211 and 212 and a connection part 213. The first and second land parts 211 and 212 are disposed on one side of each bonding pad 110, and the connection part 213 connects the first land part 211 and the second land part 212 with each other. Each of the first and second land parts 211 and 212 has a circular shape when viewed from the top. In another embodiment, however, each of the first and second land parts 211 and 212 may have a polygonal shape when viewed from the top. Although it is illustrated and explained in the present embodiment that two land parts are formed, it is to be noted that at least three land parts may be formed.

In the present embodiment, the connection part 213 has a linear shape when viewed from the top. The connection part 213 has a line width smaller than the first and second land parts 211 and 212. For example, when a line width of the first and second land parts 211 and 212 is W1, a line width W2 of the connection part 213 has a range of $1/10 \times W1$ to $1/2 \times W1$. Further, a length L of the connection part 213 has a range of $1/10 \times W1$ to $5 \times W1$.

The first bump 210 includes any one selected from the group comprising copper (Cu), nickel (Ni), aluminum (Al), carbon nanotubes, gold (Au), silver (Ag) and lead (Pb).

The second bump 220 is formed on the first bump 210. The second bump 220 has the same shape as the first bump 210 when viewed from the top. The second bump 220 projects in the is shape of hemispheres on the first and second land parts 211 and 212, and is formed thin on the surface of the connection part 213. The second bump 220 is formed of a material which has a melting point lower than that of the first bump 210. For example, the second bump 220 includes any one selected from the group comprising an alloy of Sn, Ag and Cu, an alloy of Pb and Sn and an alloy of In and Bi.

The redistribution lines 300 are formed on the bonding pads 110 and the first insulation layer pattern 121, and connect the bonding pads 110 of the semiconductor chip 100 with the first bumps 210. In the present embodiment, one end of the redistribution lines 300 are connected to the bonding pads 110 of the semiconductor chip 100, and the other end of the redistribution lines 300, which face away from the one end, are connected to the first land parts 211 of the first bumps 210. In the present embodiment, the redistribution lines 300 are formed integrally with the first bumps 210.

The second insulation layer pattern 400 is formed on the first insulation layer pattern 121 in such a way as to cover the redistribution lines 300 and expose the bumps 200.

Figure 18:
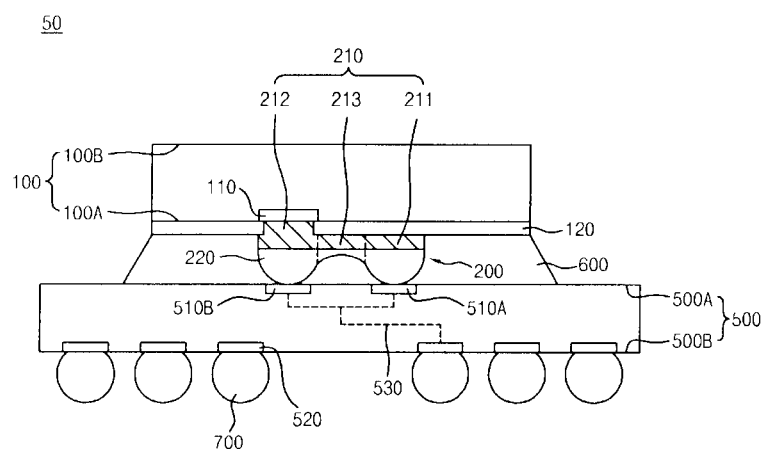
FIG. 18 is a cross-sectional view illustrating a semiconductor package in accordance with another embodiment of the present invention.

FIG. 18 is a cross-sectional view illustrating a semiconductor package in accordance with another embodiment of the present invention.

Referring to FIG. 18, a semiconductor package 50 in accordance with the present embodiment of the invention has a structure in which the semiconductor package 10 described above with reference to FIGS. 9 and 10 is mounted to a substrate 500 having first and second bond fingers 510A and 510B by the medium of bumps 200. Accordingly, repeated descriptions for the same component parts will be omitted herein, and the same technical terms and the same reference symbols will be used for the same component parts.

Although it is illustrated and described in the present embodiment that the semiconductor package 10 described above with reference to FIGS. 9 and 10 is used, it is conceivable that any one of the semiconductor packages 20, 30 and 40 described above with reference to FIGS. 11 through 17 can be used.

The substrate 500 has a third surface 500A which faces a semiconductor chip 100 and a fourth surface 500B which faces away from the third surface 500A. The substrate 500 includes the first and second bond fingers 510A and 510B, ball lands 520, and circuit patterns 530. The first and second bond fingers 510A and 510B are formed on the third surface 500A of the substrate 500 in such a way as to respectively correspond to projecting portions of second bumps 220. The ball lands 520 are formed on the fourth surface 500B of the substrate 500. External connection terminals 700 such as solder balls are mounted to the ball lands 520. The circuit patterns 530 include multi-layered circuit lines (not shown) and conductive vias (not shown) which connect the circuit lines formed on different layers. The circuit patterns 530 electrically connect the first bond fingers 510A, the second bond fingers 510B and the ball lands 520 with one another.

The semiconductor chip 100 is mounted to the substrate 500 such that the projecting portions of the second bumps 220 are respectively connected to the first and second bond fingers 510A and 510B of the substrate 500. In other words, the projecting portions of each second bump 220 are connected to the first bond finger 510A and the second bond finger 510B, respectively.

In order to improve the reliability of joints, an underfill material 600 is filled between the semiconductor chip 100 and the substrate 500.

Figure 19:
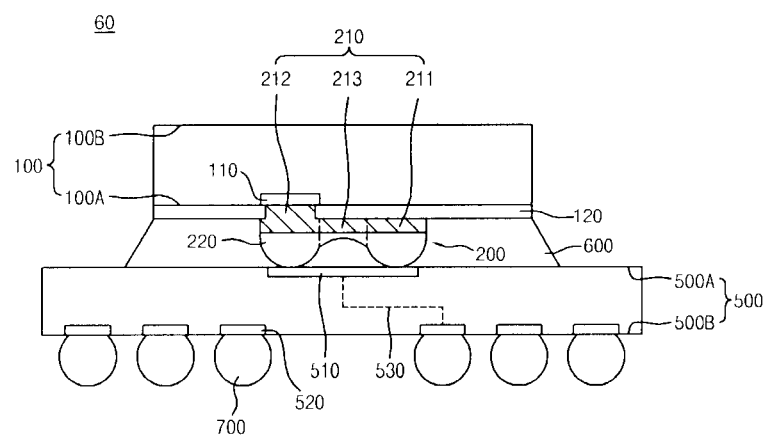
FIG. 19 is a cross-sectional view illustrating a semiconductor package in accordance with another embodiment of the present invention.

FIG. 19 is a cross-sectional view illustrating a semiconductor package in accordance with another embodiment of the present invention.

Referring to FIG. 19, a semiconductor package 60 in accordance an embodiment of the invention has a structure in which the semiconductor package 10 described above with reference to FIGS. 9 and 10 is mounted to a substrate 500 having bond fingers 510 by the medium of bumps 200. Accordingly, repeated descriptions for the same component parts will be omitted herein, and the same technical terms and the same reference symbols will be used for the same component parts.

Although it is illustrated and described in the present embodiment that the semiconductor package 10 described above with reference to FIGS. 9 and 10 is used, it is conceivable that any one of the semiconductor packages 20, 30 and 40 described above with reference to FIGS. 11 through 17 can be used.

The substrate 500 has a third surface 500A which faces a semiconductor chip 100 and a fourth surface 500B which faces away from the third surface 500A. The substrate 500 includes the bond fingers 510, ball lands 520, and circuit patterns 530. The bond fingers 510 are formed on the third surface 500A of the substrate 500 in such a way as to correspond to the bumps 200. The ball lands 520 are formed on the fourth surface 500B of the substrate 500. External connection terminals 700 such as solder balls are mounted to the ball lands 520. The circuit patterns 530 include multi-layered circuit lines (not shown) and conductive vias (not shown) which connect the circuit lines formed on different layers. The circuit patterns 530 electrically connect the bond fingers 510 and the ball lands 520 with each another.

The semiconductor chip 100 is mounted to the substrate 500 such that the projecting portions of second bumps 220 are simultaneously connected to the bond fingers 510 of the substrate 500. In other words, the projecting portions of each second bump 220 are simultaneously connected to each bond finger 510.

In order to improve the reliability of joints, an underfill material 600 is filled between the semiconductor chip 100 and the substrate 500.

Figure 20:
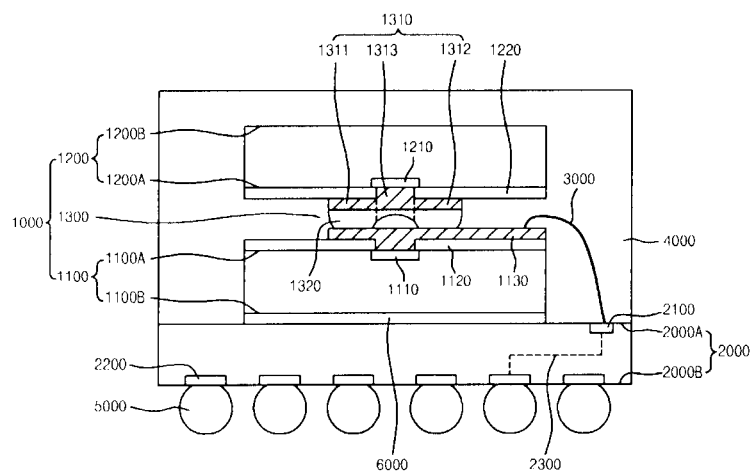
FIG. 20 is a cross-sectional view illustrating a stacked semiconductor package in accordance with another embodiment of the present invention.

FIG. 20 is a cross-sectional view illustrating a stacked semiconductor package in accordance with another embodiment.

Referring to FIG. 20, a stacked semiconductor package in accordance with an embodiment of the invention includes a stacked semiconductor chip module 1000, a substrate 2000, and connection members 3000. Besides, the stacked semiconductor package can further include a molding member 4000 and external connection terminals 5000.

The stacked semiconductor chip module 1000 includes a first semiconductor chip 1100, a second semiconductor chip 1200, and bumps 1300.

The first semiconductor chip 1100 has a first surface 1100A and a second surface 1100B which faces away from the first surface 1100A. First bonding pads 1110 are formed on the first surface 1100A of the first semiconductor chip 1100. In the present embodiment, a plurality of first bonding pads 1110 are formed along a center portion of the first surface 1100A of the first semiconductor chip 1100. That is to say, the first semiconductor chip 1100 has a center pad type structure.

A first insulation layer pattern 1120, which has openings for exposing the first bonding pads 1110, is formed on the first surface 1100A of the first semiconductor chip 1100.

Redistribution lines 1130 are formed on the first bonding pads 1110 and the first insulation layer pattern 1120 to redistribute the first bonding pads 1110 to the edge portion of the first semiconductor chip 1100. One ends of the redistribution lines 1130 are connected to the first bonding pads 1110, and the other ends of the redistribution lines 1130, which face away from the one ends, are disposed on the edge portion of the first semiconductor chip 1100.

The second semiconductor chip 1200 and the bumps 1300 have substantially the same constructions as in the semiconductor package 10 according to the embodiment described above with reference to FIGS. 9 and 10.

In detail, referring again to FIG. 20, the second semiconductor chip 1200 has a third surface 1200A which faces the first surface 1100A of the first semiconductor chip 1100 and a fourth surface 1200B which faces away from the third surface 1200A.

Second bonding pads 1210 are formed on the third surface 1200A of the second semiconductor chip 1200. In the present embodiment, a plurality of second bonding pads 1210 are formed along a center portion of the third surface 1200A of the second semiconductor chip 1200. That is to say, the second semiconductor chip 1200 has a center pad type structure. A second insulation layer pattern 1220, which has openings for exposing the second bonding pads 1210, is formed on the third surface 1200A of the second semiconductor chip 1200.

The bumps 1300 are formed on the third surface 1200A of the second semiconductor chip 1200, and connect the second bonding pads 1210 of the second semiconductor chip 1200 with the redistribution lines 1130 of the first semiconductor chip 1100. Each bump 1300 includes a first bump 1310 which is formed on the third surface 1200A of the second semiconductor chip 1200 and a second bump 1320 which is formed on the first bump 1310. That is to say, the bump 1300 has a double structure.

The first bump 1310 includes first and second land parts 1311 and 1312 and a connection part 1313. In the present embodiment, the first and second land parts 1311 and 1312 are disposed on the second insulation layer pattern 1220 of the second semiconductor chip 1200 and are respectively positioned on both sides of each second bonding pad 1210. The connection part 1313 is connected to the second bonding pad 1210 and connects the first land part 1311 and the second land part 1312 with each other across the second bonding pad 1210. Each of the first and second land parts 1311 and 1312 has a circular shape when viewed from the top. Unlike this, each of the first and second land parts 1311 and 1312 may have a polygonal shape when viewed from the top. Although it is illustrated and explained in the present embodiment that two land parts are formed, it is to be noted that at least three land parts may be formed.

In the present embodiment, the connection part 1313 has a linear shape when viewed from the top. The connection part 1313 has a line width smaller than the first and second land parts 1311 and 1312. For example, the line width of the connection part 1313 has a range of 1/10 to 1/2 times the line width of the first and second land parts 1311 and 1312. Further, a length of the connection part 1313 has a range of 1/10 to 5 times the line width of the first and second land parts 1311 and 1312.

The first bump 1310 includes any one selected from the group comprising copper (Cu), nickel (Ni), aluminum (Al), carbon nanotubes, gold (Au), silver (Ag) and lead (Pb).

The second bump 1320 is formed on the first bump 1310. The second bump 1320 has the same shape as the first bump 1310 when viewed from the top. The second bump 1320 projects in the shape of hemispheres on the first and second land parts 1311 and 1312, and is formed thin on the surface of the connection part 1313. The second bump 1320 is formed of a material which has a melting point lower than that of the first bump 1310. For example, the second bump 1320 includes any one selected from the group comprising an alloy of Sn, Ag and Cu, an alloy of Pb and Sn and an alloy of In and Bi.

Although it is illustrated and described in the present embodiment that the second semiconductor package 1200 and the bumps 1300 are the same as those in the semiconductor package 10 described above with reference to FIGS. 9 and 10, it is conceivable that the second semiconductor package 1200 and the bumps 1300 may have the same constructions as those in any one of the semiconductor packages 20, 30 and 40 described above with reference to FIGS. 11 through 17.

The substrate 2000 supports the stacked semiconductor chip module 1000. The substrate 2000 has an upper surface 2000A which faces the stacked semiconductor chip module 1000 and a lower surface 2000B which faces away from the upper surface 2000A.

The stacked semiconductor chip module 1000 is attached to the upper surface 2000A of the substrate 2000 by the medium of an adhesive member 6000. The substrate 2000 includes bond fingers 2100, ball lands 2200, and circuit patterns 2300. The bond fingers 2100 are disposed on the upper surface 2000A of the substrate 2000 outside the stacked semiconductor chip module 1000, and the ball lands 2200 are disposed on the lower surface 2000B of the substrate 2000. The circuit patterns 2300 include multi-layered circuit lines (not shown) and conductive vias (not shown) which connect the circuit lines formed on different layers. The circuit patterns 2300 electrically connect the bond fingers 2100 and the ball lands 2200 with each other.

The connection members 3000 electrically connect the redistribution lines 1300 of the first semiconductor chip 1000 with the bond fingers 2100 of the substrate 2000. The connection members 3000 include bonding wires.

The molding member 4000 seals the upper surface 2000A of the substrate 2000 including the stacked semiconductor chip module 1000, and the external connection terminals 5000 are mounted to the ball lands 2200 of the substrate 2000.

As is apparent from the above description, in the embodiments of the present invention, since a bump with two projecting portions are formed using one mask, the manufacturing cost can be reduced and the number of processes can be decreased. Also, because defective rates of a semiconductor package and a stacked semiconductor package with a flip chip structure using bumps decrease, the manufacturing yield can be increased.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
a semiconductor chip having a first surface on which bonding pads are formed and a second surface which faces away from the first surface;
bumps formed on the first surface of the semiconductor chip and electrically connected with the bonding pads, wherein each bump comprises a first bump formed on the semiconductor chip and having at least two land parts and a connection part which connects the land parts and has a line width smaller than the land parts, and a second bump formed on the first bump and projecting on the land parts of the first bump in shapes of a hemisphere; and
redistribution lines formed on the first surface of the semiconductor chip and connecting the bonding pads with the connection part.

2. The semiconductor package according to claim 1, wherein the second bump has the same shape as the first bump when viewed from the top.

3. The semiconductor package according to claim 1, wherein the land parts have at least one of circular or polygonal shapes when viewed from the top.

4. The semiconductor package according to claim 1, wherein the line width of the connection part corresponds to 1/10 to 1/2 times a line width of the land part.

5. A semiconductor package comprising:
a semiconductor chip having a first surface on which bonding pads are formed and a second surface which faces away from the first surface;
bumps formed on the first surface of the semiconductor chip and electrically connected with the bonding pads, wherein each bump comprises a first bump formed on the semiconductor chip and having at least two land parts and a connection part which connects the land parts and has a line width smaller than the land parts, and a second bump formed on the first bump and projecting on the land parts of the first bump in shapes of a hemisphere;
redistribution lines formed on the first surface of the semiconductor chip and connecting the bonding pads with the connection part of the first bump; and
a substrate having bond fingers two of which are respectively connected to projecting portions of each second bump.

6. A stacked semiconductor package comprising:
a stacked semiconductor chip module including a first semiconductor chip having a first surface on which first bonding pads and redistribution lines connected to the first bonding pads are formed and a second surface which faces away from the first surface, a second semiconductor chip stacked over the first semiconductor chip and having a third surface which faces the first semiconductor chip and on which second bonding pads are formed, and bumps formed on the third surface of the second semiconductor chip and electrically connecting the second bonding pads of the second semiconductor chip with the redistribution lines of the first semiconductor chip;
a substrate supporting the stacked semiconductor chip module;
connection members electrically connecting the redistribution lines of the first semiconductor chip with the substrate, and
wherein each bump comprises:
a first bump formed on the third surface of the second semiconductor chip and having at least two land parts and a connection part which connects the land parts and has a line width smaller than the land parts; and
a second bump formed on the first bump, projecting on the land parts of the first bump in shapes of a hemisphere, and connected to the redistribution lines of the first semiconductor chip,
additional redistribution lines formed on the third surface of the second semiconductor chip and electrically connecting the second bonding pads of the second semiconductor chip with the bumps.

7. The stacked semiconductor package according to claim 6, wherein any one of the land parts is connected to each second bonding pad of the second semiconductor chip.

8. The stacked semiconductor package according to claim 6, wherein the connection part is connected to each second bonding pad of the second semiconductor chip.

9. The bump according to claim 1, wherein the second bump has a melting point lower than that of the first bump.

10. The bump according to claim 1, wherein the first bump includes any one selected from the group consisting of copper (Cu), nickel (Ni), aluminum (Al), carbon nanotubes, gold (Au), silver (Ag) and lead (Pb).

11. The bump according to claim 1, wherein the second bump includes any one selected from the group consisting of an alloy of tin (Sn), silver (Ag) and copper (Cu), an alloy of lead (Pb) and tin (Sn) and an alloy of indium (In) and bismuth (Bi).

12. The bump according to claim 5, wherein the second bump has the same shape as the first bump when viewed from the top.

13. The bump according to claim 5, wherein the land parts have at least one of circular or polygonal shapes when viewed from the top.

14. The bump according to claim 5, wherein the line width of the connection part corresponds to $1/10$ to $1/2$ times a line width of the land part.

15. The bump according to claim 5, wherein the second bump has a melting point lower than that of the first bump.

16. The bump according to claim 5, wherein the first bump includes any one selected from the group consisting of copper (Cu), nickel (Ni), aluminum (Al), carbon nanotubes, gold (Au), silver (Ag) and lead (Pb).

17. The bump according to claim 5, wherein the second bump includes any one selected from the group consisting of an alloy of tin (Sn), silver (Ag) and copper (Cu), an alloy of lead (Pb) and tin (Sn) and an alloy of indium (In) and bismuth (Bi).

* * * * *